(12) United States Patent
Titschert et al.

(10) Patent No.: US 6,864,673 B2
(45) Date of Patent: Mar. 8, 2005

(54) METHOD AND CIRCUIT ARRANGEMENT FOR MEASURING EARTH LEAKAGES IN INTRINSICALLY SAFE CURRENT FEEDS

(75) Inventors: Jens Titschert, Lunen (DE); Emmanuel Charruau, Lunen (DE); Helmut Hermann, Bochum (DE)

(73) Assignee: DBT Automation GmbH, Lunen (DE)

( * ) Notice: Subject to any disclaimer, the term of this patent is extended or adjusted under 35 U.S.C. 154(b) by 0 days.

(21) Appl. No.: 10/376,549

(22) Filed: Feb. 28, 2003

(65) Prior Publication Data

US 2003/0160618 A1 Aug. 28, 2003

(30) Foreign Application Priority Data

Feb. 28, 2002 (DE) .......................................... 102 08 941

(51) Int. Cl.$^7$ ............................................. G01R 33/00
(52) U.S. Cl. .................................. 324/117 R; 324/158.1
(58) Field of Search ........................... 324/117 R, 158.1, 324/510–512, 519, 522–523, 532

(56) References Cited

U.S. PATENT DOCUMENTS 4,293,813 A * 10/1981 Groenenboom ......... 324/117 R
5,818,236 A    10/1998 Sone et al.

FOREIGN PATENT DOCUMENTS

DE      39 01 277 A1    7/1990
WO      WO 01/55738 A2  8/2001

* cited by examiner

*Primary Examiner*—Minh N. Tang
(74) *Attorney, Agent, or Firm*—Cook, Alex, McFarron, Manzo, Cummings & Mehler, Ltd.

(57) ABSTRACT

A method and a circuit arrangement (10) for the measurement of earth leakage in intrinsically safe current feeds to electronic control units (4) for underground mining installations and machines, whereby at least one earthed control unit is connected to the two intrinsically safe potentials of an intrinsically safe direct current supply (1) and at least one earth leakage sensor (20) is provided for earth leakage measurement with which steps of the periodical application of a test potential ($U_{mess}$) from an intrinsically safe switchable test voltage source (21) to an RC-element (22), isolated from earth (8) by means of decoupling capacitors (C1, C2), measurement of the charging or discharging current behaviour of the RC-element (22) after each switching of the test voltage source (21) and comparison of the measured charging or discharging behaviour with stored reference data.

13 Claims, 3 Drawing Sheets

METHOD AND CIRCUIT ARRANGEMENT FOR MEASURING EARTH LEAKAGES IN INTRINSICALLY SAFE CURRENT FEEDS

The present invention relates to a method for measuring earth leakage in the intrinsically safe current supplies to a electronic controller for underground mining installations and machines and a circuit arrangement for the measurement of earth leakages in the current feeds whereby using the circuit arrangement at least one earth control unit is connected to both of the intrinsically safe potentials of a direct current supply and at least one earth leakage sensor is provided for earth leakage measurement.

BACKGROUND OF THE INVENTION (1) Field of the Invention

In underground mining, owing to the dangers of fire-damp and explosions, intrinsically safe designs are exclusively employed for control and regulating current supplies. The permitted voltage and current values in intrinsically safe current supplies lie below the least spark energy for the applicable explosion or fire-damp endangered regions. In mining operations the alternating voltage of the supply network is transformed into an intrinsically safe direct voltage of, for instance, 12 volts and fed into a following intrinsically safe current feed. Onto this intrinsically safe current supply a number of electrical control units are connected, with which for instance electro hydraulic support frame controllers of advancing support frame units are connected, which are employed to support the mining area in underground workings. In such electro-hydraulic operated installations the switching currents available for the initiation of movement of the control values of the hydraulic props and the advancing pistons is only small. A faulty operating current can cause the undesired stopping or release of one or more actuators of the electro hydraulic support controllers, from which functional disturbances in automatic supports and/or the endangering of the safety of the underground personnel can result. A number of switching faults can lead to a failure of the entire support installation.

(b) Description of Related Art

It is proposed in DE-A-3901277 that simple earth leakage can lead to functional faults or a complete failure of the electronic control. In DE-A-3901277 therefore in order to ensure a largely failure-free operation of electronic controllers in intrinsically safe installations, a circuit arrangement is proposed for testing for earth leakage which comprises a test sensor which can be remotely operated and periodically forms a test circuit with a current testing device switched in using an interval switch periodically between the one intrinsically safe potential of the current feed and the protective conductor or the other intrinsically safe potential of the current feed and the protective conductor. Both measurement circuits have a high value control resistance, which can be switched in for a control measurement between the second potential and the protective conductor so as to simulate an artificial earth leakage between the potentials and to be able to prove the satisfactory functioning of the test instruments in the measurement circuit. At intervals using both test circuits even during the operation of the underground installation, a simple earth leakage between one of the potentials and the protective conductor can be indicated. The earth leakage test sensor forms hereby two test circuits separated from each other and at any time an earth leakage can only be established between the potential of the active test circuit and the protective conductor, whilst in the period of time of this measurement an earth leakage from the other potential cannot be established. In particular transient earth leakages can therefore not be detected with the previously proposed circuit arrangement.

The requirements for and the permitted measurements in intrinsically safe current circuits are laid down in the standard EN 50020. The standard includes inter alia a condition that the installation between one intrinsically safe circuit and parts, which can be earthed, must be able to withstand the effective value of a test alternating voltage of 2×500 volts. For reasons of protection against explosion, no potential difference measuring intrinsically safe earth leakage test equipment can be permanently installed in the current feed of an intrinsically safe installation.

BRIEF SUMMARY OF THE INVENTION

It is an aim of the present invention to produce a method and a circuit arrangement for measuring earth leakage which make possible the permanent detection of earth leakage from both potentials of the intrinsically safe DC supply, using an intrinsically safe earth leakage sensor.

Accordingly a first aspect of the present invention is directed to a method for measuring each leakages in intrinsically safe current feeds to an electronic controller for underground mining installations and equipment, whereby at least one control unit connected to both of the intrinsically safe potentials of a direct current supply and at least one earth leakage sensor is provided for earth leakage measurement, which performs the steps of periodic application of a test potential from a switchable intrinsically safe test voltage source to an RC-element, isolated from earth by means of decoupling capacitors, measurement of the charging and/or discharging behaviour of the capacitor of the RC-element after each switching of the test voltage source and comparison of the measured charging and/or discharging current behaviour with stored reference data. The method according to the present invention is derived from the recognition that in intrinsically safe current circuits the connection of a test potential from an intrinsically safe test voltage source to earth via the connection of at least two decoupling capacitors with an operating voltage of 500 volts is permitted. Since these capacitors do not pass direct current, no direct current measurement is possible; but however by the construction of an RC-element an indirect current measurement can be effected by the connection for a determined period of one or the other test potentials from the test voltage source. Since the RC-element is isolated by the decoupling capacitors, the capacitor of the RC-element can only be charged or discharged by parasitic current flows as there is no earth connection present. If on the other hand an earth connection with an ohmic content is present, then the ohmic content of the output capacity of the RC-element changes and consequently a changed charge and discharge ratio of the capacitor of the RC-element sets in. In the reference data it is possible to store for the RC-element in use, whose capacity and limiting resistor is known, under which charging and discharging ratios no earth leakage is present and under which charging and discharging ratios an earth leakage must have arisen. From a comparison of the charging and discharging curves with the reference data it can then be established whether a simple earth leakage has occurred during the current or the previous test cycle.

In a preferred embodiment of the method the period of time to reach a determined voltage change of the capacitor or the RC-element is measured during the charging and discharging process and compared with the corresponding reference data, so that each charging or discharge curve is defined by a test value. Preferably a test voltage is generated from the test voltage source, which is lower than the control voltage of the switching elements in the control units. These measures prevent the changing of a switching condition of one of the control equipments by the test voltage source. Advantageously in the switching the RC-element during the charging period is connected to the higher test potential of the test voltage source and during the discharge period to the lower test potential of the test voltage source. The lower test potential of the test voltage source can here preferably correspond to the lower potential of the direct current source and especially amount to 0 Volt. In a preferred embodiment the comparison, control and evaluation is performed using a microprocessor integrated into the sensor and the measured time values for the charging and discharging performance are taken to it.

A second aspect of the present invention is directed to a circuit arrangement as described in the opening paragraph of the present specification, in which the earth leakage sensor has a switchable intrinsically safe test voltage source for periodic application of a test potential by means of a control and evaluation device to an RC-element isolated from earth by the connection of decoupling capacitors, whereby using the control and evaluation device the charging and discharging behaviour of the capacity of the RC-element can be measured after each switching of the test potential from the test voltage source and changes in the charging or discharging behaviour as compared to reference data can be detected. As with the method according to the present invention the measurement of earth leakage using the circuit arrangement according to the present invention also relies upon an indirect current measurement by means of the defined time controlled feed of an RC-element isolated from earth with two different potentials from the test voltage source and the comparison of the charging or discharging ratios of the capacitor of the RC-element against reference data. If a change of the actual charging or discharging ratio as against the reference data arises, it may be concluded that an earth leakage exists and this can consequently be detected.

In a preferred embodiment the period to reach a determined voltage change on the capacitor of the RC-element can be measured and compared with corresponding reference data. Advantageously at least one of the decoupling capacitors is a component of the RC-element. Preferably the test voltage, which is generated using the test voltage source, is less than the control voltage for the switching elements in the control equipments, whereby the test voltage advantageously amounts to 2.5 volts. Normal control voltages for the switching elements in the control equipments lie at 3.3 volts or higher.

Advantageously for switching the feed to the RC-element an electronic switch is provided such as preferably a switching transistor, which facilitates short switching times. In a preferred embodiment the control and evaluation device comprises a microprocessor integrated in the sensor. Advantageously microprocessor includes an analogue/digital converter, in which the test values such as especially the measured time durations can be read back. The microprocessor, its A/D-converter and the test device can be isolated by further decoupling capacitors from earth. In order to satisfy the standard, preferably the decoupling capacitors comprise two capacitors connected in series with nominal voltages of at least 500 volts.

BRIEF DESCRIPTION OF THE SEVERAL VIEWS OF THE DRAWINGS

A circuit arrangement and a method for measuring earth leakages in an intrinsically safe current feeds according to the present invention will now be described with reference to the accompanying drawings, in which.

DETAILED DESCRIPTION OF THE INVENTION

Figure 1:
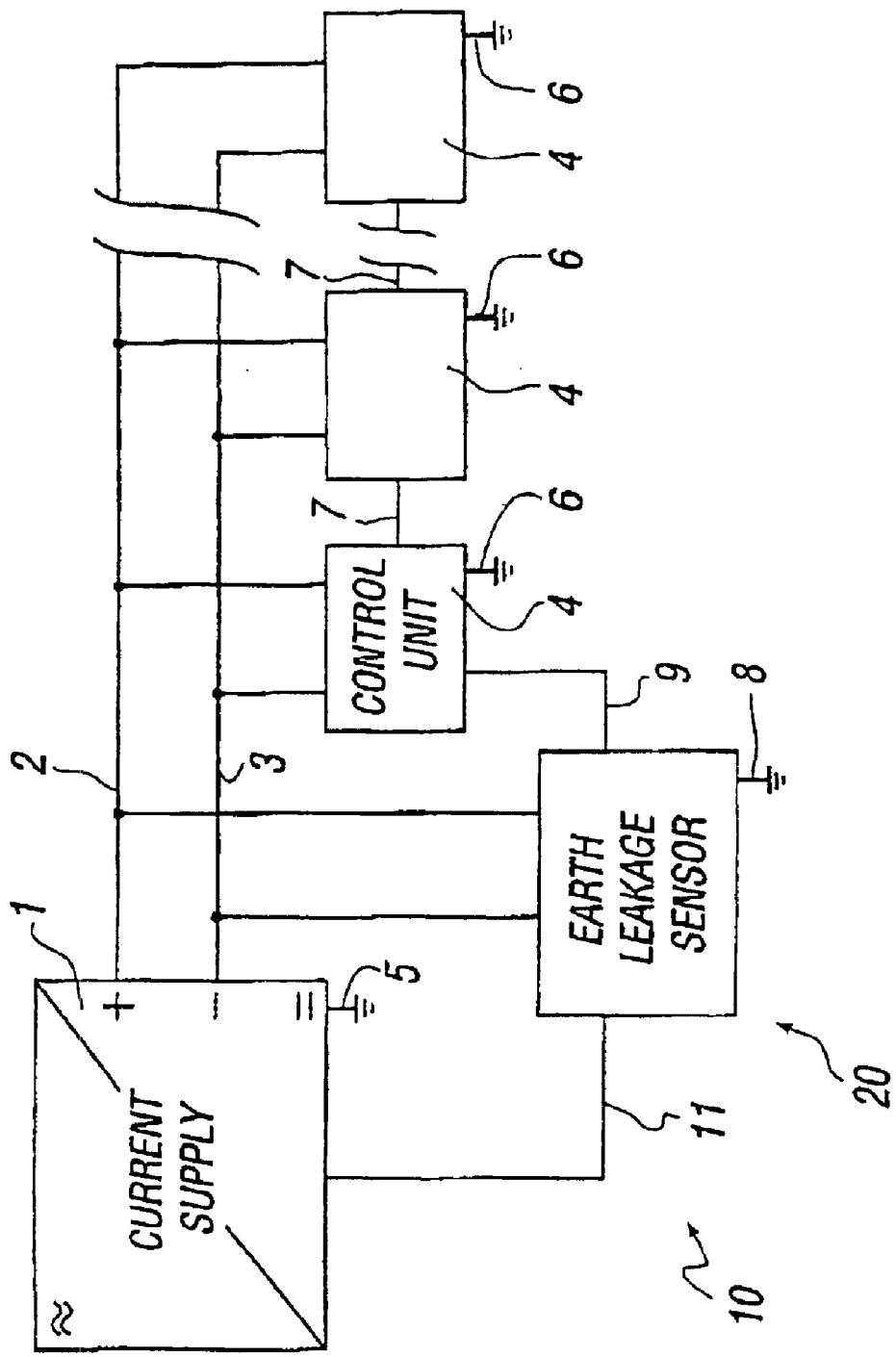
FIG. 1 shows a schematic circuit diagram of an intrinsically safe current feed with controllers and earth leakage sensor attached.

FIG. 1 shows a circuit arrangement 10 with an intrinsically safe direct current supply 1, which converts alternating current from a supply network into an intrinsically safe direct current of, for example, 12 volts.

The direct current supply 1 feeds several control units 4 via a first conducting cable 2 which is connected to positive terminal or potential (+) of the direct current source and a second conductor cable 3 which is connected to the negative terminal or potential (−) of the direct current source 1. The housing of the direct current supply 1 and the housing of the control units 4 are earthed via the earth connections 5 or 6. There further occurs as indicated by the individual connection 7 a potential equalisation for example via the cable screening between all the control units 4 and the direct current source 1.

The earth leakage detector 20 can be connected at any desired position on the conducting cables 2, 3 attached to the intrinsically safe current supply 1. The housing of the earth leakage sensor 20 is earthed via the earth connection 8 and a potential equalisation can also here take place as indicated with the connecting conductors 9 and 11, e.g. via the cable screening. Using the earth leakage detector 20 a first earth leakage in one of the supply cables 2, 3 or in the control units 4 can be detected and to avoid operational disturbance recorded and evaluated in the control effected by the control units 4, for instance of a further electro hydraulic advancing support frame, not shown.

Figure 2:
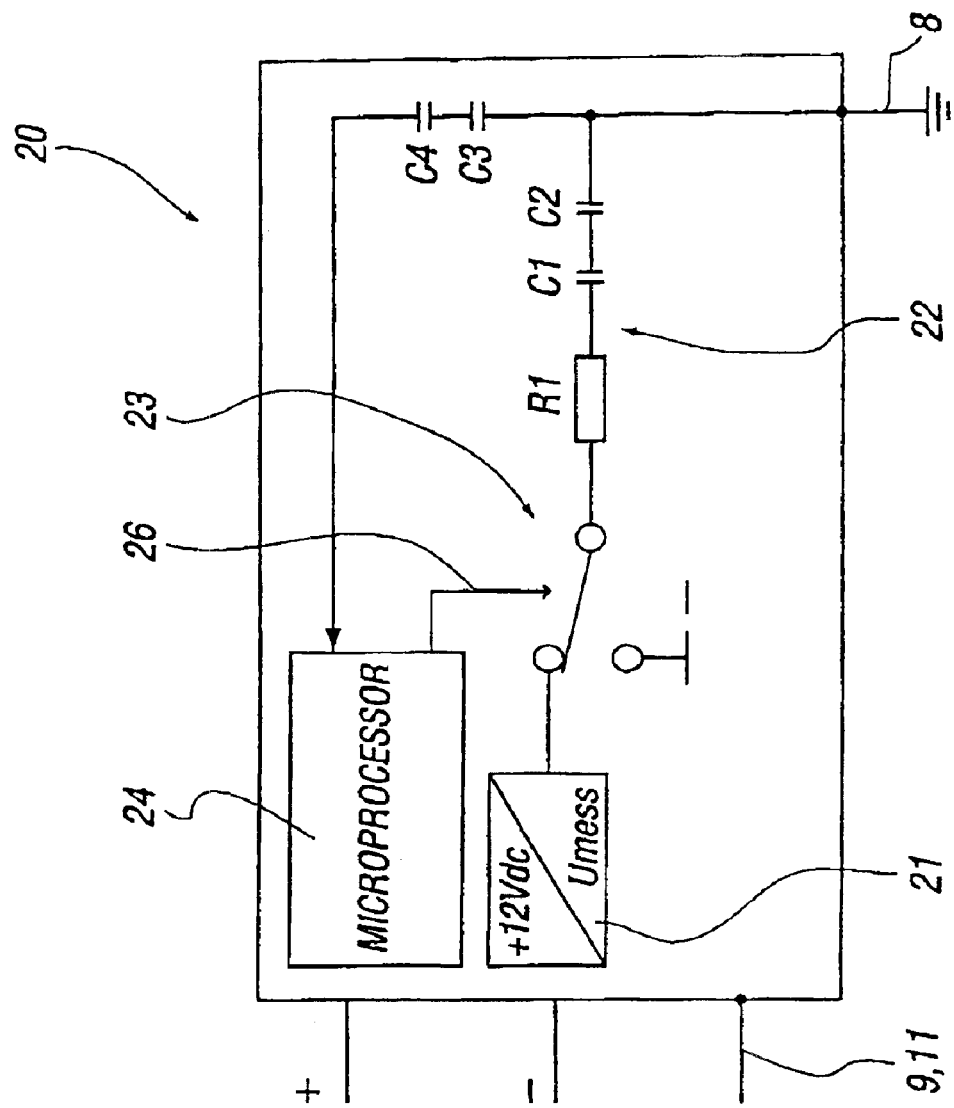
FIG. 2 shows a schematic circuit diagram of the essential functional elements of the earth leakage detector according to the invention.
Figure 4:
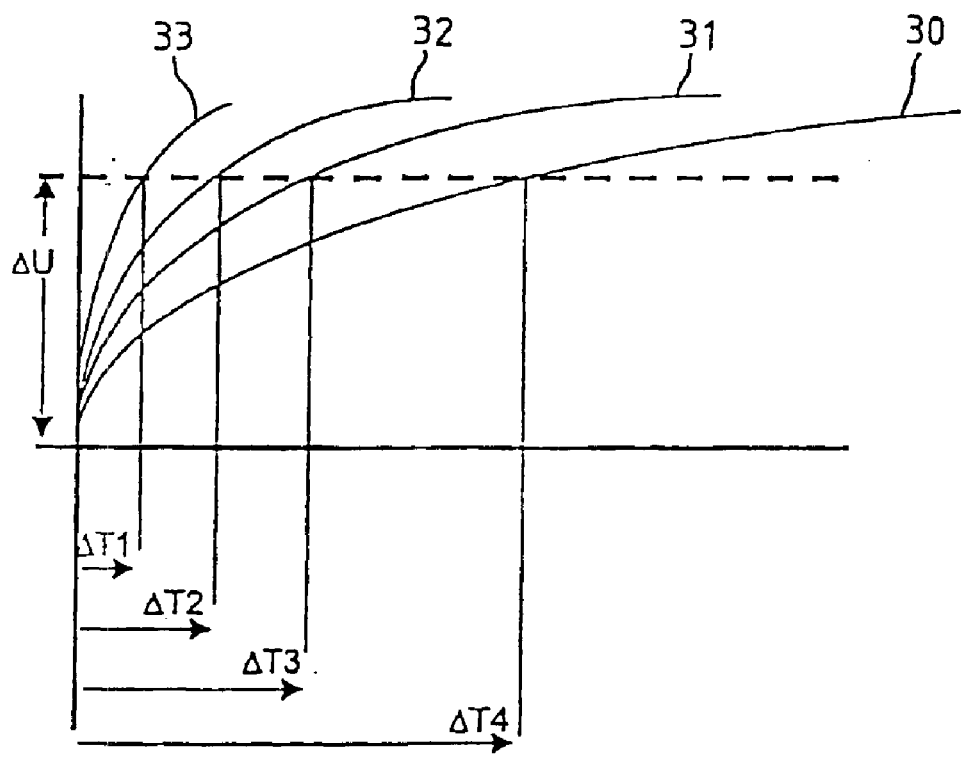
FIG. 4 shows a graph of charge against time with different charging and discharging curves.

The essential functional parts of the earth leakage sensor 20 are shown in FIG. 2. The earth leakage sensor 20 has a test voltage source 21, which converts the intrinsically safe DC voltage of here preferably 12 volts into a test voltage $U_{mess}$ of preferably 2.5 volts. The earth leakage sensor 20 comprises an RC-element 22 as the time element which comprises a series circuit of a high resistance current limiting resistor R1, a first capacitor C1, and a second capacitor C2, and which is joined directly and permanently to the earthing point 8. The two decoupling capacitors C1 and C2 are capacitors for nominal voltages of at least 500 volts. These capacitors are not conductive for direct currents but however permit an indirect current measurement owing to their connection in series with the defined current limiting resistor R1 and the construction of the RC-element 22. To this end the RC-element 22 is switched as indicated by the switch 23 between the two different test potentials of for instance an intrinsically safe zero volt and an intrinsically safe 2.5 volt of the test voltage source 21 at defined times and fed with them for defined periods. If no earth leakage is present the RC-element 22 is charged slowly by parasitic current flow and following the switching of the test voltage source 21 and connection to the negative potential (−) of the test voltage source 21 or the DC voltage supply 1, is discharged at the same speed. In the case of an earth leakage free charging and discharging process a charge and discharge curve is set up here as for instance is shown in FIG. 4 in the curve 30. If on the other hand an earth leakage is present or arises for a short period during the charging or discharging cycle, the discharge or the charging curve changes and a substantially faster charge or discharge takes place. Depending upon the resistance of the earth leakage, the charging or discharging curve can correspond to one of the curves 31, 32 or 33 in FIG. 4.

The reference data for the charging and discharge curves 30, 31, 32, 33 are stored in a microprocessor 24 integrated into the earth leakage sensor 20 and the microprocessor 24 facilitates the comparison of the charging and discharging behaviour of the RC-element 22 setting up during the current test period with the stored reference data. In a preferred embodiment as shown in FIG. 4, the time duration $\Delta T$ is measured for each test process until a preset voltage change $\Delta U$ has been set up in the microprocessor 24, whereby each time span $\Delta T_1$, $\Delta T_2$, $\Delta T_3$, $\Delta T_4$, for the prescribed voltage change $\Delta U$ from the microprocessor is representative for one of the charge curves 31, 32, 33 in the case of an earth leakage or the charging curve 30 without earth leakage.

The measurement using a suitable test device, not further described, is based upon pure time measurement $\Delta T$ up to the time that a voltage change $\Delta U$ occurs on the RC-element 22 and this time value set up after each switching change on the RC-element 22 as shown symbolically with arrow 26 in FIG. 2, is read back in a suitable manner in an analogue-/digital converter of the microprocessor 24. In order to guarantee the intrinsically safe design of the earth leakage sensor 20 hereby the test device, the analogue-/digital converter and the microprocessor 24 are isolated from the earth connection 8 by means of further decoupling capacitors. C3, C4.

Figure 3:
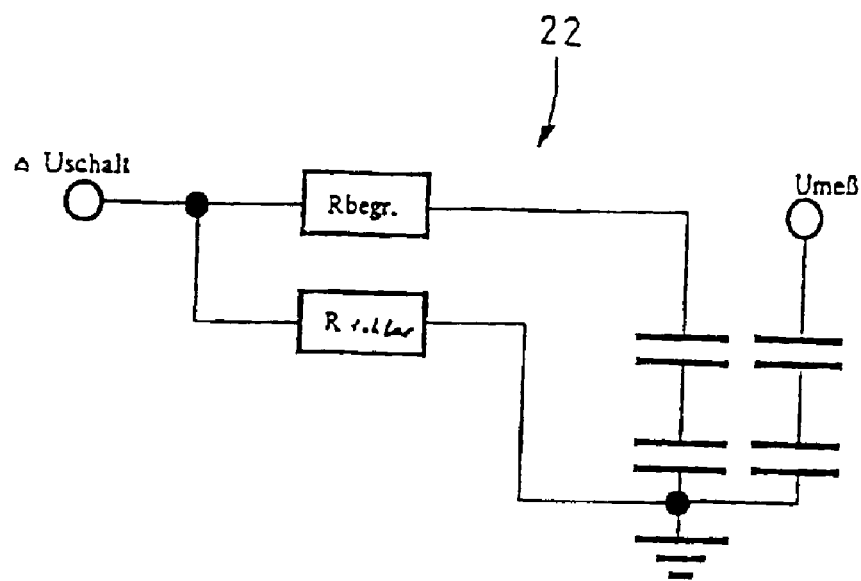
FIG. 3 shows a schematic circuit diagram to illustrate the circuit engineering effects of an earth leakage resistance.

The time $\Delta T$ passing following the switching over of the test voltage source 21 until the established potential change $\Delta U$ at the same time permits also, because the capacity and the original limiting resistance of the RC-element 22 are known and each $\Delta T$ is representative for one of the discharge or charging curves 30, 31, 32, 33, the calculation of the overall resistance resulting from the earth leakage $R_{fehler}$ (cf. FIG. 3) and thus also a calculation of the resistance of the earth leakage. The RC-element 22 of the earth leakage sensor 20 changes its loading curve if a leakage to earth occurs in both potentials +, − of the current feed 2, 3 independently of whether the RC-element 22 is charged or discharged so that a permanent earth leakage detection can be realised.

What is claimed is:

1. A method for measuring earth leakages in intrinsically safe current feeds to electronic controllers for underground mining installations and machines, in which at least one earthed control unit is connected to both intrinsically safe potentials of a direct current supply and at least one earth leakage sensor is provided for earth leakage measurement, which performs the steps of periodical application of a test potential from a switchable intrinsically safe test voltage source to an RC-element, isolated from earth by means of decoupling capacitors, measurement of the charging or discharging current behaviour of the RC-element after each switching of the test voltage source and comparison of measured charging or discharging behaviour with stored reference data.

2. A method according to claim 1, in which a period of time to reach a determined voltage change of the RC-element is measured during a charging and discharging process and compared with corresponding reference data.

3. A method according to claim 1, in which a test voltage is generated from the test voltage source, which is less than a control voltage of switching elements in control units.

4. A method according to claim 1, in which in the switching the RC-element during a charging period is connected to the higher test potential of the test voltage source and during a discharge period to the lower test potential of the test voltage source which preferably corresponds to the lower potential of the direct current supply and amounts to 0 Volt.

5. A method according to claim 1, in which the comparison, control and evaluation is performed using a microprocessor integrated in the sensor.

6. A circuit arrangement for measuring earth leakages in intrinsically safe current feeds to a electronic controllers for underground mining installations and machines, in which using the circuit arrangement at least one earthed control unit is connected to both intrinsically safe potentials of a direct current supply and at least one earth leakage sensor is provided for earth leakage measurement, in which the earth leakage sensor has a switchable intrinsically safe test voltage source for periodic application of a test potential by means of a control and evaluation device to an RC-element isolated from earth by a connection of decoupling capacitors, in which using the control and the evaluation device the charging and discharge behaviour of the RC-element capable of being measured after each switching of the test potential of the test voltage source and changes in the charging or discharging behaviour as compared to reference data can be detected.

7. A circuit arrangement according to claim 6, in which using the control and a test device, a period to reach a determined voltage change of the RC-element capable of being measured and compared with corresponding reference data.

8. A circuit arrangement according to claim 6, in which a test voltage, which is generated using a test voltage source, is less than a control voltage for switching elements in intrinsically safe control units and amounts to 2.5 volt.

9. A circuit arrangement according to claim 6, characterised in that for switching the feed of the RC-element an electronic switch is provided.

10. A circuit arrangement according to claim 6, in which the control and evaluation device comprises a microprocessor integrated in the sensor.

11. A circuit arrangement according to claim 10, in which the microprocessor includes an analogue/digital converter, in which test values can be red back.

12. A circuit arrangement according to claim 6, in which the decoupling capacitors comprise two capacitors connected in series with nominal voltages of at least 500 volts.

13. A circuit arrangement according to claim 9, in which the electronic switch is a switching transistor.

* * * * *